(12) United States Patent
Dong et al.

(10) Patent No.: US 7,883,602 B2
(45) Date of Patent: Feb. 8, 2011

(54) ELECTRODE ASSEMBLY FOR THE REMOVAL OF SURFACE OXIDES BY ELECTRON ATTACHMENT

(75) Inventors: Chun Christine Dong, Macungie, PA (US); Wayne Thomas McDermott, Fogelsville, PA (US); Alexander Schwarz, Bethlehem, PA (US); Gregory Khosrov Arslanian, Pipersville, PA (US); Richard E. Patrick, Tamaqua, PA (US); Gary A. Orbeck, Windham, NH (US); Donald A. Seccombe, Jr., Gloucester, MA (US)

(73) Assignees: Air Products and Chemicals, Inc., Allentown, PA (US); BTU International, Inc., North Billerica, MA (US)

( * ) Notice: Subject to any disclaimer, the term of this patent is extended or adjusted under 35 U.S.C. 154(b) by 0 days.

(21) Appl. No.: 12/188,667

(22) Filed: Aug. 8, 2008

(65) Prior Publication Data
US 2008/0295966 A1 Dec. 4, 2008

Related U.S. Application Data

(62) Division of application No. 10/819,225, filed on Apr. 7, 2004, now Pat. No. 7,563,380.

(51) Int. Cl.
C23F 1/08 (2006.01)
H01J 37/32 (2006.01)
(52) U.S. Cl. ................................. 156/345.51
(58) Field of Classification Search ............ 156/345.51
See application file for complete search history.

(56) References Cited

U.S. PATENT DOCUMENTS

| 3,742,213 A | 6/1973 | Cohen et al. |
| 5,102,523 A | 4/1992 | Beisswenger et al. |
| 5,105,761 A | 4/1992 | Charlet et al. |
| 5,192,582 A | 3/1993 | Liedke et al. |
| 5,345,056 A | 9/1994 | Frei et al. |
| 5,409,543 A | 4/1995 | Panitz et al. |

(Continued)

FOREIGN PATENT DOCUMENTS

DE 19717698 A1 10/1998

(Continued)

OTHER PUBLICATIONS

Human Translation of WO 99/01886A1 published Jan. 14, 1999.*

(Continued)

*Primary Examiner*—Sylvia R. MacArthur
(74) *Attorney, Agent, or Firm*—Lina Yang

(57) ABSTRACT

An apparatus and a method comprising same for removing metal oxides from a substrate surface are disclosed herein. In one particular embodiment, the apparatus comprises an electrode assembly that has a housing that is at least partially comprised of an insulating material and having an internal volume and at least one fluid inlet that is in fluid communication with the internal volume; a conductive base connected to the housing comprising a plurality of conductive tips that extend therefrom into a target area and a plurality of perforations that extend therethrough and are in fluid communication with the internal volume to allow for a passage of a gas mixture comprising a reducing gas.

13 Claims, 11 Drawing Sheets

U.S. PATENT DOCUMENTS

| | | | |
|---|---|---|---|
| 5,433,820 A | 7/1995 | Sindzingre et al. |
| 5,459,632 A | 10/1995 | Birang et al. |
| 5,481,084 A | 1/1996 | Patrick et al. |
| 5,493,177 A | 2/1996 | Muller et al. |
| 5,722,581 A | 3/1998 | Sindzingre et al. |
| 5,790,365 A | 8/1998 | Shel |
| 5,807,614 A | 9/1998 | Sindzingre et al. |
| 5,807,615 A | 9/1998 | Sindzingre et al. |
| 5,827,158 A | 10/1998 | Drecksel |
| 5,858,312 A | 1/1999 | Sindzingre et al. |
| 5,928,527 A | 7/1999 | Li et al. |
| 5,941,448 A | 8/1999 | Sindzingre et al. |
| 5,985,378 A | 11/1999 | Paquet |
| 6,004,631 A | 12/1999 | Mori |
| 6,007,637 A | 12/1999 | Sindzingre et al. |
| 6,021,940 A | 2/2000 | Sindzingre et al. |
| 6,037,241 A | 3/2000 | Powell et al. |
| 6,080,283 A | 6/2000 | Ray |
| 6,089,445 A | 7/2000 | Sindzingre et al. |
| 6,146,503 A | 11/2000 | Sindzingre et al. |
| 6,158,648 A | 12/2000 | Mori et al. |
| 6,174,500 B1 | 1/2001 | Uno et al. |
| 6,193,135 B1 | 2/2001 | Fang et al. |
| 6,194,036 B1 | 2/2001 | Babayan et al. |
| 6,196,446 B1 | 3/2001 | Fang et al. |
| 6,203,637 B1 | 3/2001 | Dommann et al. |
| 6,250,540 B1 | 6/2001 | Egitto et al. |
| 6,270,862 B1 | 8/2001 | McMillin et al. |
| 6,468,833 B2 | 10/2002 | Uner et al. |
| 6,551,860 B2 | 4/2003 | Uner et al. |
| 6,605,175 B1 | 8/2003 | Ramm et al. |
| 6,620,299 B1 | 9/2003 | Fietzke et al. |
| 6,656,540 B2 | 12/2003 | Sakamoto et al. |
| 6,716,302 B2 | 4/2004 | Carducci et al. |
| 6,734,102 B2 | 5/2004 | Rathi et al. |
| 6,776,330 B2 | 8/2004 | Dong et al. |
| 6,946,401 B2 | 9/2005 | Huang et al. |
| 7,079,370 B2 | 7/2006 | Dong et al. |
| 7,307,826 B2 | 12/2007 | Dong et al. |
| 2002/0070357 A1 | 6/2002 | Kim et al. |
| 2003/0047591 A1 | 3/2003 | Dong et al. |
| 2004/0018320 A1 | 1/2004 | Nicolussi |
| 2004/0094400 A1 | 5/2004 | Ichiki et al. |
| 2004/0211675 A1 | 10/2004 | Dong et al. |
| 2004/0226831 A1 | 11/2004 | Dong et al. |
| 2004/0231597 A1 | 11/2004 | Dong et al. |
| 2005/0183666 A1 | 8/2005 | Tsuji et al. |
| 2005/0241670 A1 | 11/2005 | Dong et al. |
| 2008/0149690 A1 | 6/2008 | Dong et al. |
| 2008/0295966 A1 * | 12/2008 | Dong et al. ............ 156/345.51 |

FOREIGN PATENT DOCUMENTS

| | | |
|---|---|---|
| EP | 0997926 | 5/2000 |
| EP | 1291111 A1 | 3/2003 |
| EP | 1 473 105 A | 11/2004 |
| EP | 1 475 179 A | 11/2004 |
| EP | 1795291 A1 | 6/2007 |
| EP | 1827066 A2 | 8/2007 |
| JP | 11214320 A | 8/1999 |
| JP | 2000-311868 A | 11/2000 |
| JP | 2001267729 | 9/2001 |
| JP | 2002-367962 A | 12/2002 |
| WO | 9901886 | 1/1999 |
| WO | WO 99/01886 A1 * | 1/1999 |
| WO | 00/65887 A | 11/2000 |
| WO | 0141963 | 6/2001 |

OTHER PUBLICATIONS

Potier N., et al., "Fluxless Soldering Under Activated Atmosphere at Ambient Pressure"|.

Koopman, N., et al., "Fluxless Flip Chip Solder Joining," pp. 919-931.

Shiloh, P. J., et al., "Flux-Free Soldering," pp. 251-273.

* cited by examiner

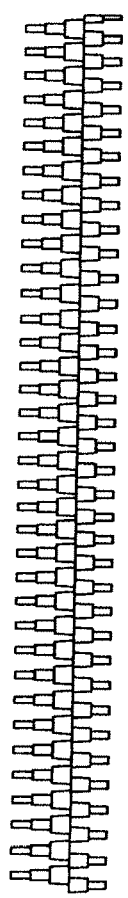
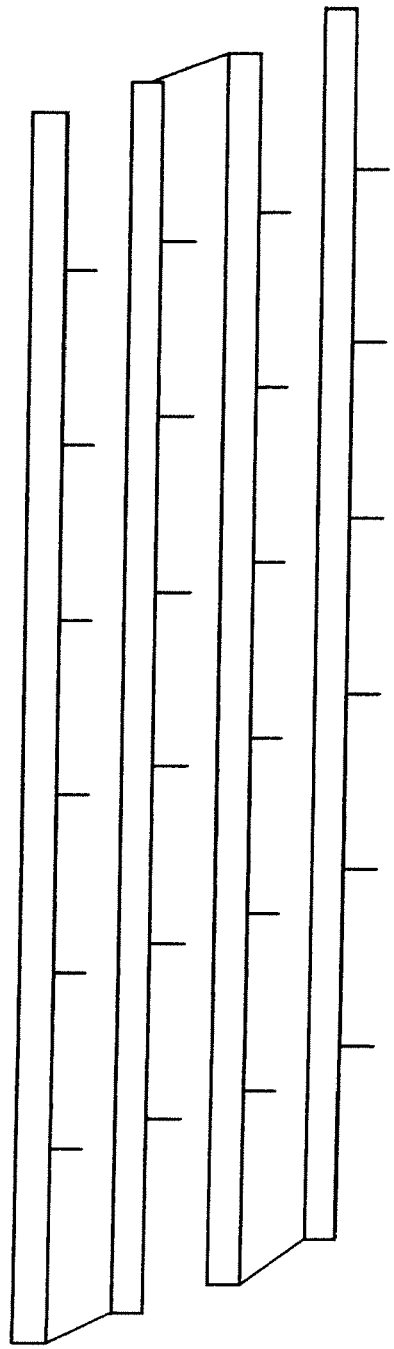
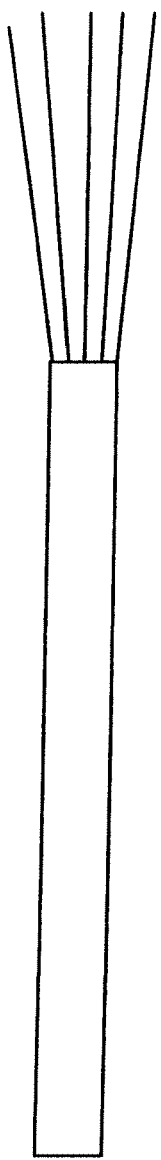
Figure 2e
Figure 2f
Figure 2g

ELECTRODE ASSEMBLY FOR THE REMOVAL OF SURFACE OXIDES BY ELECTRON ATTACHMENT

CROSS-REFERENCE TO RELATED APPLICATIONS

This application is a divisional application of U.S. patent application Ser. No. 10/819,225 filed Apr. 07, 2004, which is a continuation-in-part of U.S. patent application Ser. No.10/425,405 filed Apr. 28, 2003.

BACKGROUND OF THE INVENTION

A fluxless process and apparatus for removing metal oxides from the surface of a substrate are disclosed herein. More specifically, a method and apparatus for the fluxless reflow of solders on a substrate surface, particularly for wafer bumping applications, are disclosed herein.

Wafer bumping is a process used to make thick metal bumps on the chip bond pads for inner lead bonding. The bumps are commonly made by depositing a solder on the pads and then reflowing (referred to herein as a first reflow) to conduct alloying and to change the shape of the solder bump from a mushroom-shape into a hemispherical-shape. The chip with the first-reflowed bumps is "flipped" to correspond to the footprint of the solder wettable terminals on the substrate and then subjected to a second reflow to form solder joints. These solder joints are referred to herein as inner lead bonds. High-melting point solders (e.g., >300° C.) are normally used in the wafer bumping process because it allows for subsequent assembly steps such as outer lead bonding to proceed using lower-melting point solders (e.g., <230° C.) without disruption of the inner lead bonds.

The shape of the solder bumps after the first reflow is critical. For example, a large bump height is preferable for better bonding and higher fatigue resistance. Further, the bumps formed should preferably be substantially uniform to ensure planarity. Substantially uniform solder bumps having relatively larger bump heights is believed to be associated with an oxide-free bump surface during the first reflow. Currently, there are two major approaches of removing solder oxides during first reflow of the solder bumped wafer. One approach is fluxless soldering using pure hydrogen at a reflow temperature of 400 to 450° C. The major challenge of this approach is the flammable nature of the pure hydrogen, which largely limits the application of this approach. The second approach is applying organic fluxes over the deposited solder bumps, or within a solder paste mixture that has been printed onto the wafer to form the bumps, and reflowing the bumps in an inert environment so that the fluxes can effectively remove initial oxides on the solder surface. However, this approach has its drawbacks. Small voids may form in the solder bumps due to flux decomposition. These voids may not only degrade the electrical and mechanical properties of the formed solder bonds but also destroy the co-planarity of the solder bumped wafer and affect the subsequent chip bonding process. The decomposed flux volatiles can also contaminant the reflow furnace that can increase the maintenance cost. In addition, flux residues are oftentimes left upon the wafer, which can cause corrosion and degrade the performance of the assembly.

To remove the flux residues from the reflow processes described above, a post cleaning process may be adopted using chlorofluorcarbons (CFCs) as cleaning agents. However, post-cleaning adds an additional process step and increases the manufacturing processing time. Further, the use of chlorofluorocarbons (CFCs) as cleaning agents is banned due to the potential damage to the earth's protective ozone layer. Although no-clean fluxes have been developed by using a small amount of activators to reduce residues, there is a trade-off between the gain and loss in the amount of flux residues and the activity of the fluxes. Therefore, a catalytic method to assist generating highly reactive $H_2$ radicals, and thus reducing the effective ranges of hydrogen concentration and processing temperature for reducing surface oxides, has been sought by the industry.

Fluxless (dry) soldering has been performed in the prior art using several techniques. One technique is to employ lasers to ablate or heat metal oxides to their vaporization temperatures. Such processes are typically performed under inert or reducing atmospheres to prevent re-oxidation by the released contaminants. However, the melting or boiling points of the oxide and base metal can be similar and it may not be desirable to melt or vaporize the base metal. Therefore, such laser processes are difficult to implement. Lasers are typically expensive and inefficient to operate and require a direct line of sight to the oxide layer. These factors limit the usefulness of laser techniques for most soldering applications.

Surface oxides can be chemically reduced (e.g., to $H_2O$) through exposure to reactive gases (e.g., $H_2$) at elevated temperatures. A mixture containing 5% or greater reducing gas in an inert carrier (e.g., $N_2$) is typically used. The reaction products (e.g., $H_2O$) are then released from the surface by desorption at the elevated temperature and carried away in the gas flow field. Typical process temperatures exceed 350° C. However, this process can be slow and ineffective, even at elevated temperatures.

The speed and effectiveness of the reduction process can be increased using more active reducing species. Such active species can be produced using conventional plasma techniques. Gas plasmas at audio, radio, or microwave frequencies can be used to produce reactive radicals for surface de-oxidation. In such processes, high intensity electromagnetic radiation is used to ionize and dissociate $H_2$, $O_2$, $SF_6$, or other species, including fluorine-containing compounds, into highly reactive radicals. Surface treatment can be performed at temperatures below 300° C. However, in order to obtain optimum conditions for plasma formation, such processes are typically performed under vacuum conditions. Vacuum operations require expensive equipment and must be performed as a slow, batch process rather than a faster, continuous process. Also, plasmas are typically dispersed diffusely within the process chamber and are difficult to direct at a specific substrate area. Therefore, the reactive species cannot be efficiently utilized in the process. Plasmas can also cause damage to process chambers through a sputtering process, and can produce an accumulation of space charge on dielectric surfaces, leading to possible microcircuit damage. Microwaves themselves can also cause microcircuit damage, and substrate temperature may be difficult to control during treatment. Plasmas can also release potentially dangerous ultraviolet light. Such processes also require expensive electrical equipment and consume considerable power, thereby reducing their overall cost effectiveness.

U.S. Pat. No. 5,409,543 discloses a process for producing a reactive hydrogen species (i.e., atomic hydrogen) using a hot filament to thermally dissociate molecular hydrogen in a vacuum condition. The energized hydrogen chemically reduces the substrate surface. The temperature of the hot filament may range from 500° C. to 2200° C. Electrically biased grids are used to deflect or capture excess free electrons emitted from the hot filament. The reactive species or atomic hydrogen is produced from mixtures containing 2% to 100% hydrogen in an inert carrier gas.

U.S. Pat. No. 6,203,637 discloses a process for activating hydrogen using the discharge from a thermionic cathode. Electrons emitted from the thermionic cathode create a gas phase discharge, which generates active species. The emission process is performed in a separate or remote chamber containing a heated filament. Ions and activated neutrals flow into the treatment chamber to chemically reduce the oxidized metal surface. However, such hot cathode processes require vacuum conditions for optimum effectiveness and filament life. Vacuum operations require expensive equipment, which must be incorporated into soldering conveyor belt systems, thereby reducing their overall cost effectiveness.

Potier, et al., "Fluxless Soldering Under Activated Atmosphere at Ambient Pressure", Surface Mount International Conference, 1995, San Jose, Calif., and U.S. Pat. Nos. 6,146,503, 6,089,445, 6,021,940, 6,007,637, 5,941,448, 5,858,312 and 5,722,581 describe processes for producing activated $H_2$ (or other reducing gases, such as $CH_4$ or $NH_3$) using electrical discharge. The reducing gas is generally present at "percent levels" in an inert carrier gas ($N_2$). The discharge is produced using an alternating voltage source of "several kilovolts". Electrons emitted from electrodes in a remote chamber produce exited or unstable species that are substantially free of electrically charged species, which are then flowed to the substrate. The resulting processes reduce oxides on the base metal to be soldered at temperatures near 150° C. However, such remote discharge chambers require significant equipment costs and are not easily retrofitted to existing soldering conveyor belt systems. In addition, these processes are typically employed for pre-treating the metal surface before soldering rather than removing solder oxides.

U.S. Pat. No. 5,433,820 describes a surface treatment process using electrical discharge or plasma at atmospheric pressure from a high voltage (1 kV to 50 kV) electrode. The electrode is placed in the proximity of the substrate rather than in a remote chamber. The free electrons emitted from the electrodes produce reactive hydrogen radicals—a plasma containing atomic hydrogen—which then pass through openings in a dielectric shield placed over the oxidized substrate. The dielectric shield concentrates the active hydrogen onto those specific surface locations requiring de-oxidation. However, such dielectric shields can accumulate surface charge that may alter the electric field and inhibit precise process control. The described process is only used to flux base metal surfaces.

Accordingly, there is a need in the art to provide an economical and efficient process for fluxless reflow of solder bumped wafer under relatively low temperatures to reduce thermal energy. There is a further need in the art to provide a process and apparatus for fluxless reflow under near ambient or atmospheric pressure conditions to avoid the expense of purchasing and maintaining vacuum equipment. Additionally, there is a need in the art to provide a fluxless reflow process using a non-flammable gas environment.

BRIEF SUMMARY OF THE INVENTION

The present invention satisfies some, if not all, of the needs of the art by providing an apparatus and method for removing metal oxides from the surface of a substrate without the use of a flux. Specifically, in one aspect of the present invention, there is provided a method for removing metal oxides from the surface of a substrate to be treated comprising: providing the substrate, an electrode assembly, and a base electrode which reside within a target area wherein the electrode assembly comprises a housing that is at least partially comprised of an insulating material and having an internal volume and at least one fluid inlet that is in fluid communication with the internal volume; a conductive base connected to the housing comprising a plurality of conductive tips that extend therefrom into a target area and a plurality of perforations that extend therethrough and are in fluid communication with the internal volume to allow for a passage of a gas mixture comprising a reducing gas; wherein the base electrode is proximal to the electrode assembly and the substrate; passing the gas mixture through the target area; supplying energy to the electrode assembly to generate electrons within the target area wherein at least a portion of the electrons attach to at least a portion of the reducing gas thereby forming a negatively reducing gas; and contacting the treating surface with the negatively charged reducing gas to reduce the metal oxides on the treating surface of the substrate.

In yet another aspect of the present invention, there is provided an apparatus for removing metal oxides from a surface of a substrate comprising a plurality of solder bumps wherein the substrate resides within a target area, the apparatus comprising: an at least one energy source; at least one gas supply source that contains a gas mixture comprising a reducing source; and an emission electrode assembly in electrical communication with the at least one energy source and in fluid communication with the at least one gas supply source comprising: a housing that is at least partially comprised of an insulating material and having an internal volume and at least one fluid inlet that is in fluid communication with the internal volume and the at least one gas supply source; and a conductive base connected to the housing comprising a plurality of conductive tips that extend therefrom into the target area and a plurality of perforations that extend therethrough and are in fluid communication with the internal volume to allow for a passage of the gas mixture.

These and other aspects of the invention will become apparent from the following detailed description.

BRIEF DESCRIPTION OF SEVERAL VIEWS OF THE DRAWINGS

FIGS. 2a through 2i is a schematic illustration of various electrode geometries suitable for emission and/or retrieval of electrons.

DETAILED DESCRIPTION OF THE INVENTION

Figures 1A, 1B:
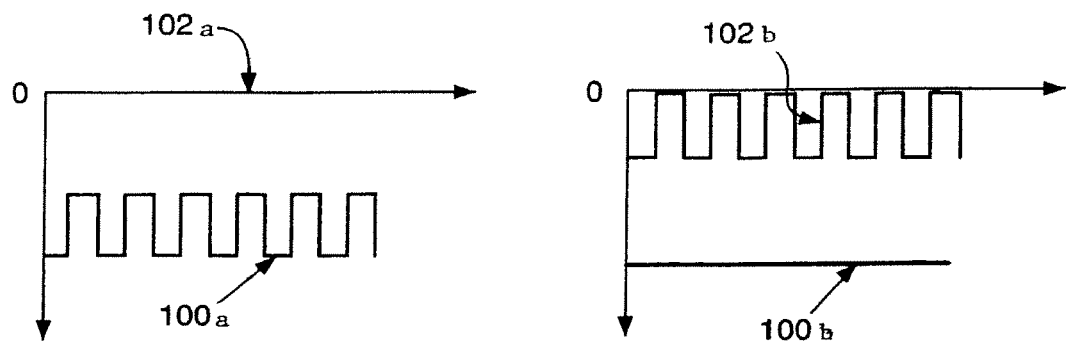
FIGS. 1a and 1b illustrate a voltage pulse on a emission and a base electrode, respectively.

The present invention relates to an apparatus and method comprising same for the removal of metal oxides from a substrate surface by exposure to negatively charged ions. The negatively charged ions react and reduce the surface metal oxides. The present invention can be employed by modifying traditional reflow and soldering equipments such as, for example, the reflow machine used for reflow of solder bumped wafer. The present invention can also be applied to other processes wherein the removal of the surface metal oxides from a substrate is desired such as, but not limited to, metal plating (i.e., the solder plating of portions of printed circuit boards or metal surfaces to make them more amenable to subsequent soldering), reflow and wave soldering for outer lead bonding, surface cleaning, brazing, welding, and removing surface oxides of metals, such as copper oxide, formed during silicon wafer processing. The removal of metal oxides using the method and apparatus of the present invention is equally applicable to the aforementioned processes or any other process desirous of removing oxides without the need for organic fluxes.

The term "substrate" as used herein generally relates to a material such as silicon, silicon coated with silicon dioxide, aluminum-aluminum oxide, gallium arsenide, ceramic, quartz, copper, glass, epoxy, or any material suitable for use within an electronic device. In certain embodiments, the substrate is an electrically insulated or semi-conductive substrate having solder disposed thereupon. Exemplary solder compositions include, but are not limited to, a fluxless tin-silver, a fluxless tin-silver-copper, a fluxless tin-lead, or a fluxless tin-copper. However, the method of the present invention is suitable for a variety of different substrates and/or solder compositions. In a certain preferred embodiment, the substrate is a silicon wafer having a plurality of solder bumps disposed thereupon.

While not wishing to be bound by theory, it is believed that when an energy source such as a direct current voltage source is applied between at least two electrodes, electrons are generated from one of the two electrodes having a negative electrical bias relative to the other electrode (referred to herein as an "emission electrode") and/or the gas phase between the two electrodes. The generated electrons drift toward the other electrode, which is grounded or has a positive electrical bias (referred to herein as a "base electrode"), along the electric field. The substrate having a plurality of solder bumps upon its surface is placed within the area defined by the base and the emission electrodes (referred to herein as the "target area") with the solder-bumped surface or treating area exposed to the emission electrode. In certain embodiments, the substrate may be connected to the base electrode forming a target assembly. A gas mixture comprising a reducing gas and optionally a carrier gas is passed through the electric field generated by the electrodes. During the electron drift, part of the reducing gas forms negative ions by electron attachment which then drift to the target assembly, i.e., the base electrode and substrate surface. On the substrate surface, negatively charged ions can thus reduce the existing metal oxides without the need for traditional fluxes. Further, the adsorption of the active species on the surface to be treated can be promoted due to the drifting of the negatively charged ions along the electric field.

In embodiments wherein the reducing gas comprises hydrogen, it is believed that the method of the present invention occurs as follows:

Dissociative Attachment $H_2 + e' \Rightarrow H^- + H$     (I)

Radiative Attachment $e' + H \Rightarrow H^- + h\gamma$     (II)

The combination of (I) and (II): $2e' + H_2 \Rightarrow 2H^- + h\gamma$     (III)

Oxide Reduction: $2H^- + MO \Rightarrow M + H_2O + 2e'$     (IV)

($M$ = solder/base metal)

In these embodiments, the activation energy of metal oxide reduction using the method disclosed herein is lower than methods that use molecular hydrogen because the formation of atomic hydrogen ions with electron attachment eliminates the energy associated with bond breaking of molecular hydrogen.

In certain embodiments, energy is supplied to at least one of the electrodes, such as for example the emission electrode, sufficient to cause the emission electrode to generate electrons. In certain embodiments, the energy source can be an electric energy or voltage source, such as an AC or DC source. Other energy sources, such as an electromagnetic energy source, a thermal energy source, or a photo energy source may also be used alone, or in combinations with any of the aforementioned energy sources. The energy source may be constant or alternatively pulsed. In certain embodiments of the present invention, the emission electrode is connected to a first voltage level and the base electrode is connected to a second voltage level. The difference in the voltage levels creates a bias in electrical potential. One of the first or the second voltage levels may be zero indicating that either of the two electrodes can be grounded.

To produce negatively charged ions by electron attachment, a large quantity of electrons needs to be generated. In this connection, the electrons can be generated by a variety of ways such as, but not limited to, cathode emission, gas discharge, or combinations thereof. Among these electron generation methods, the selection of the method depends mainly on the efficiency and the energy level of the electrons generated. For embodiments wherein the reducing gas is hydrogen, electrons having an energy level approaching 4 eV is preferred. In these embodiments, such low energy level electrons can be generated by cathode emission and/or gas discharge. The generated electrons may then drift from the emission electrode toward the base electrode, which creates a space charge. The space charge provides the electron source for generating the negatively charged hydrogen ions by electron attachment when hydrogen passes through the at least two electrodes or within the target area.

For embodiments involving electron generation through cathode emission, these embodiments may include: field emission (referred to herein as cold emission), thermal emission (referred to herein as hot emission), thermal-field emission, photoemission, and electron or ion beam emission.

Field emission involves applying an electric field with a negative bias on the emission electrode relative to the base electrode that is sufficiently high in intensity to overcome an energy barrier for electrons to be generated from the surface of the emission electrode. In certain preferred embodiments, a DC voltage is applied between the two electrodes that ranges from 0.1 to 50 kV, or from 2 to 30 kV. In these embodiments, the distance between the electrodes may range from 0.1 to 30 cm, or from 0.5 to 5 cm.

Thermal emission, on the other hand, involves using a high temperature to energize electrons in the emission electrode and separate the electrons from the metallic bond in the material of the emission electrode. In certain preferred embodiments, the temperature of the emission electrode may range from 800 to 3500° C., or from 800 to 1500° C. The emission electrode may be brought to and/or maintained at a high temperature by a variety of methods such as, but not limited to, directly heating by passing AC or DC current through the electrode; indirect heating such as contacting the cathode surface with an electrically insulated hot surface heated by a heating element, IR radiation, or combinations thereof.

Thermal-field emission is a hybrid of field emission and thermal emission methods for electron generation in which both an electric field and a high temperature are applied. Therefore, thermal-field emission may require a lesser electric field and a lower electrode temperature for generating the same quantity of electrons as compared with pure field emission and pure thermal emission. Thermal-field emission can minimize difficulties encountered with pure field emission, such as the tendency of degradation in electron emission by contamination on the emission surface, and a high restriction on the planarity and uniformity of the emission surface. Further, thermal-field emission may also avoid problems related to thermal emission such as a high potential of chemical reaction between the emission electrode and the gas phase. In embodiments wherein the thermal-field emission is used for electron generation, the temperature of the emission electrode can range from ambient to 3500° C., or from 150 to 1500° C. In these embodiments, the electric voltage can range from 0.01 to 30 KV, or from 0.1 to 10 KV.

In certain preferred embodiments, the thermal emission or thermal-field emission method is used for electron generation. In these embodiments, a high temperature emission electrode used in either of these methods may also act as a heat source for the gas mixture that is passed through the electric field generated by the two electrodes, so that the thermal energy required for heating the gas for a subsequent reflow process step can be reduced.

In certain embodiments of the present invention, the electron generation is accomplished via a combination of cathode emission and corona discharge methods. In these embodiments, an energy source such as a DC voltage is applied between the two electrodes and electrons may be generated from both the emission electrode (cold or hot) and the gas phase (corona discharge) near the emission electrode. The corona discharge is preferably minimized in order to increase the efficiency of forming negatively charged ions by electron attachment and increase the lifetime of the emission electrode.

In embodiments wherein the cathode emission mechanism is used for electron emission, the voltage applied across the two electrodes may be constant or pulsed. The frequency of the voltage pulse ranges from 0 to 100 kHz. FIGS. 1a and 1b provide an illustration of a voltage pulse on an emission electrode and a base electrode, respectively. In these embodiments, it is believed that a pulsed voltage, such as that shown in FIGS. 1a and 1b, is preferable to constant voltage to improve the amount of electron generation and to reduce the tendency of gas phase discharge.

For embodiments involving electron generation through gas discharge, these embodiments may include thermal discharge, photo-discharge, and various avalanche discharge, including glow discharge, arc discharge, spark discharge, and corona discharge. In these embodiments, electrons are generated by gas phase ionization. The gas phase is a gas mixture comprising the reducing gas and an inert gas. In certain embodiments of gas phase ionization, a voltage source is applied between two electrodes and electrons may be generated from the inert gas within the gas mixture between the two electrodes that then drift toward the positively biased electrode such as the base electrode. During this electron drift, some of these electrons may attach on the reducing gas molecules and form negatively charged ions by electron attachment. In addition, some positive ions are also created in the inert gas that then drift toward the negatively biased electrode such as the emission electrode and are neutralized at the electrode surface.

Figure 3:
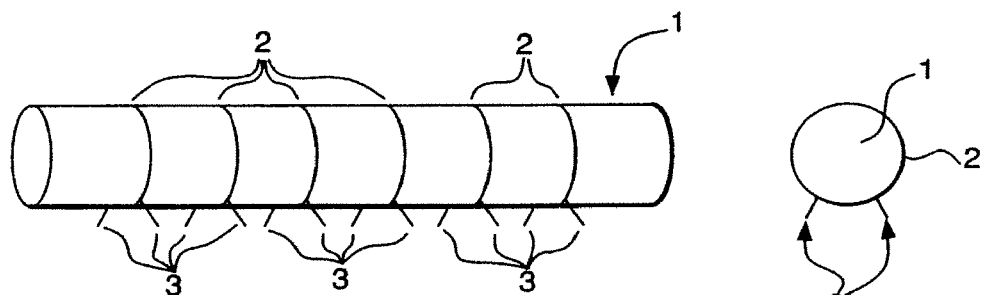
FIG. 3 provides an example of one embodiment of the electrode suitable for emission and/or retrieval of electrons employing a plurality of tips.

As mentioned previously, electrons can be generated from an emission electrode when it has a negative bias relative to a base electrode. Referring to FIGS. 2a through 2i, the emission electrode may have a variety of geometries, such as, for example, a thin wire 2a, a rod with a sharpened tip 2b, a rod with several sharpened tips or comb 2c, a screen or wire mesh 2d, a loose coil, an array of combs 2f, a bundle of thin wires or filament 2g, a rod with sharp tips protruding from its surface 2h, or a plate with a knurled surface 2i. Additional geometries may include combinations of the above geometries such as plates or rods with surface protrusions, plates or rods with tips extending therefrom, rods wrapped with wire windings or filament, coils of thin wires, etc. In embodiments where one or more electrodes extend from a conductive base, the electrodes may emanate from the substantially flat base such as the embodiment depicted in FIG. 2c, reside within a recessed well, or, alternatively, extend from a surface protrusion such as a "U" shaped or "V" protrusion. A plurality of electrodes may be employed that may be arranged in a parallel series or in an intersecting grid. Still further geometries may include a "wagon wheel" geometry wherein a plurality of electrodes is arranged in a radial fashion such as in "spokes" of a wheel. In certain embodiments, such as embodiments wherein field emission is involved, the cathode is preferably made of geometries having a large surface curvature, such as a plurality of sharp tips to maximize the electric field near the electrode surface such as the geometry depicted in FIG. 3. As FIG. 3 illustrates, electrode 1 has a series of thin wires 2 that reside within grooves on the electrode surface along with a plurality of tips 3 emanating from its surface.

Figure 11A:
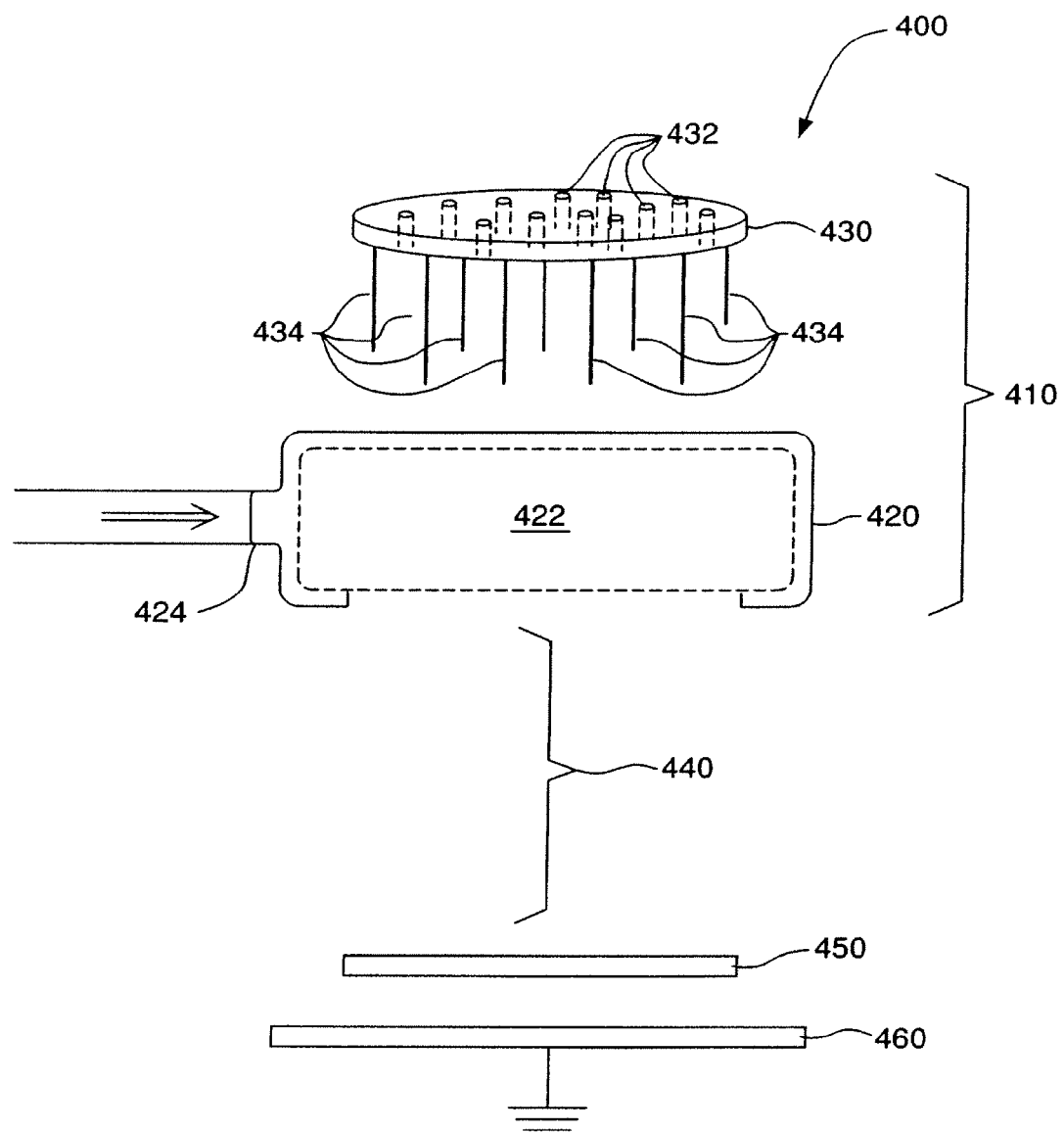
FIGS. 11a and 11b provides an exploded view and an assembled isometric view, respectively, of one embodiment of the assembly containing a plurality of electrodes.
Figure 11B:
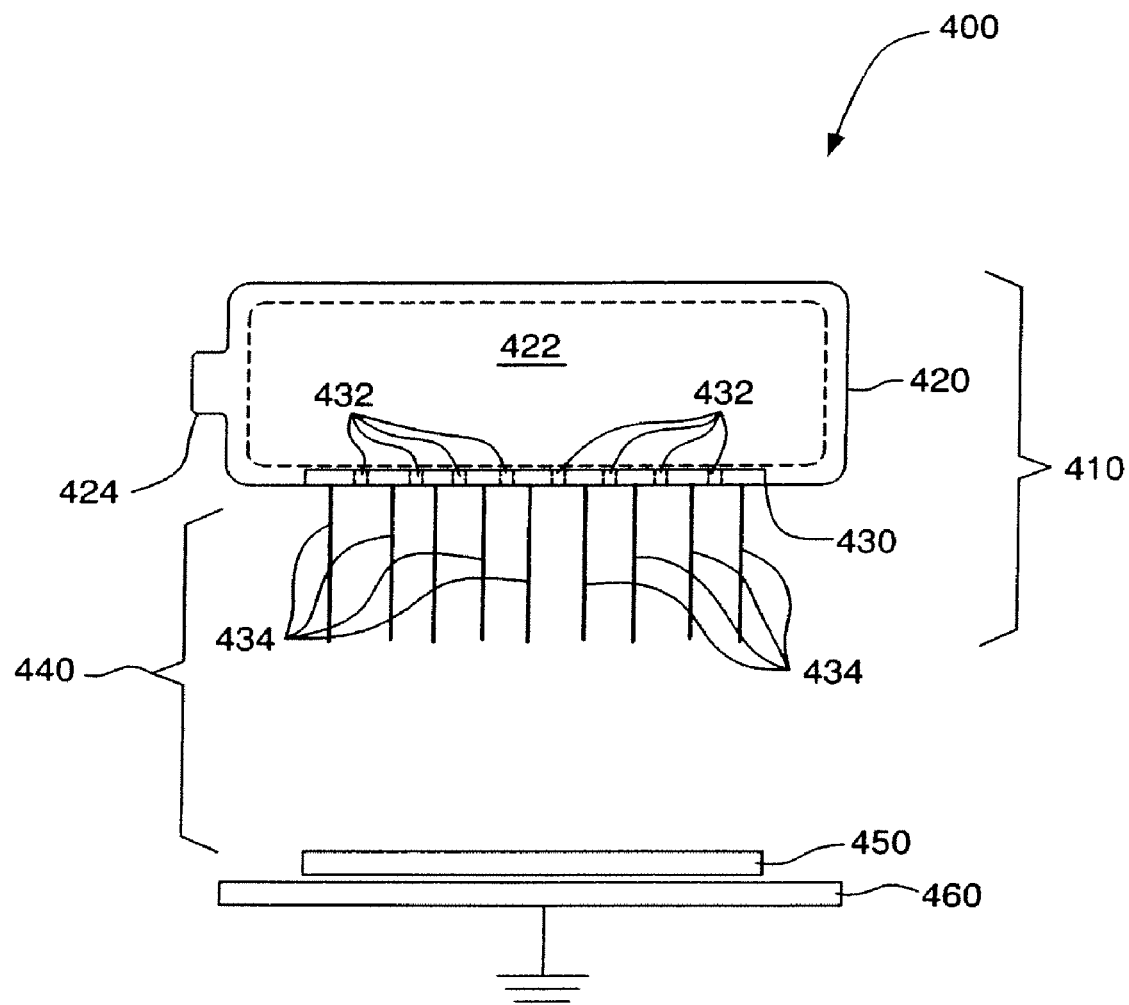

FIGS. 11a and 11b provide an illustration of an electrode assembly 410 that resides within fluxless soldering apparatus 400. In certain embodiments, electrode assembly 410 acts as an emission electrode. Fluxless soldering apparatus 400 further includes at least one energy source and at least one gas supply source (not shown). Referring to FIG. 11a, electrode assembly 410 is comprised of a housing 420 and a conductive base 430. Housing 420 is at least partially comprised of an insulating material, such as but not limited, to a ceramic. In alternative embodiments, housing 420 may be comprised of a combination of insulating and conductive materials or, alternatively, is comprised of a conductive material that is at least partially coated with an insulating material. In these later embodiments, the portion of housing 420 that is in contact with conductive base 430 and faces target area 440 is comprised of an insulating material. Housing 420 has an internal volume 422 and at least one fluid inlet 424 that is fluid communication with internal volume 422 and a gas supply source (not shown) to allow for the flow of a gas mixture through electrode assembly 410. In certain embodiments, a gas mixture comprising 4% by volume of hydrogen and the balance nitrogen may be introduced into housing 420 through at least one fluid inlet. In FIGS. 11a, 11b, and/or 11c, housing 420 and conductive base 430 are depicted as having a circular cross-section. Housing 420 and conductive base 430 may, however, have a variety of other cross-sections such as but not limited to, a square, a rectangular, an oval, or a variety of other shapes.

Conductive base 430 has plurality of perforations 432 in fluid communication with internal volume 422 and a plurality of conductive tips 434 that extends therefrom. Conductive base 430 may be disposed upon, mounted, or reside within housing 420 as shown. Alternatively, conductive base 430 and housing 420 may be an integrated unit. In certain embodiments, conductive base 430 may be in electrical communication with at least one energy source (not shown) to generate electrodes that attach to the gas mixture as it passes through the at least one fluid inlet 424 through internal volume 422 and through perforations 432 into target area 440. Soldering apparatus 400 may further comprise one or more additional electrodes such as base electrode 460 that is grounded. In certain embodiments such as that shown in FIGS. 11a and 11b, substrate 450, which contains solder bumps may be disposed upon base electrode 460 within target area 440.

Water and oxygen contaminations may result from various factors such as air leakage or reaction byproducts. In certain embodiments, these contaminations may need to be minimized within the target area. For example, in one embodiment, it is preferred that the amount of oxygen contamination be less than 20 parts per million (ppm) in the target area. These contaminations within the target area can be minimized by increasing flow rate of gas through fluid inlet 424.

Figure 11C:
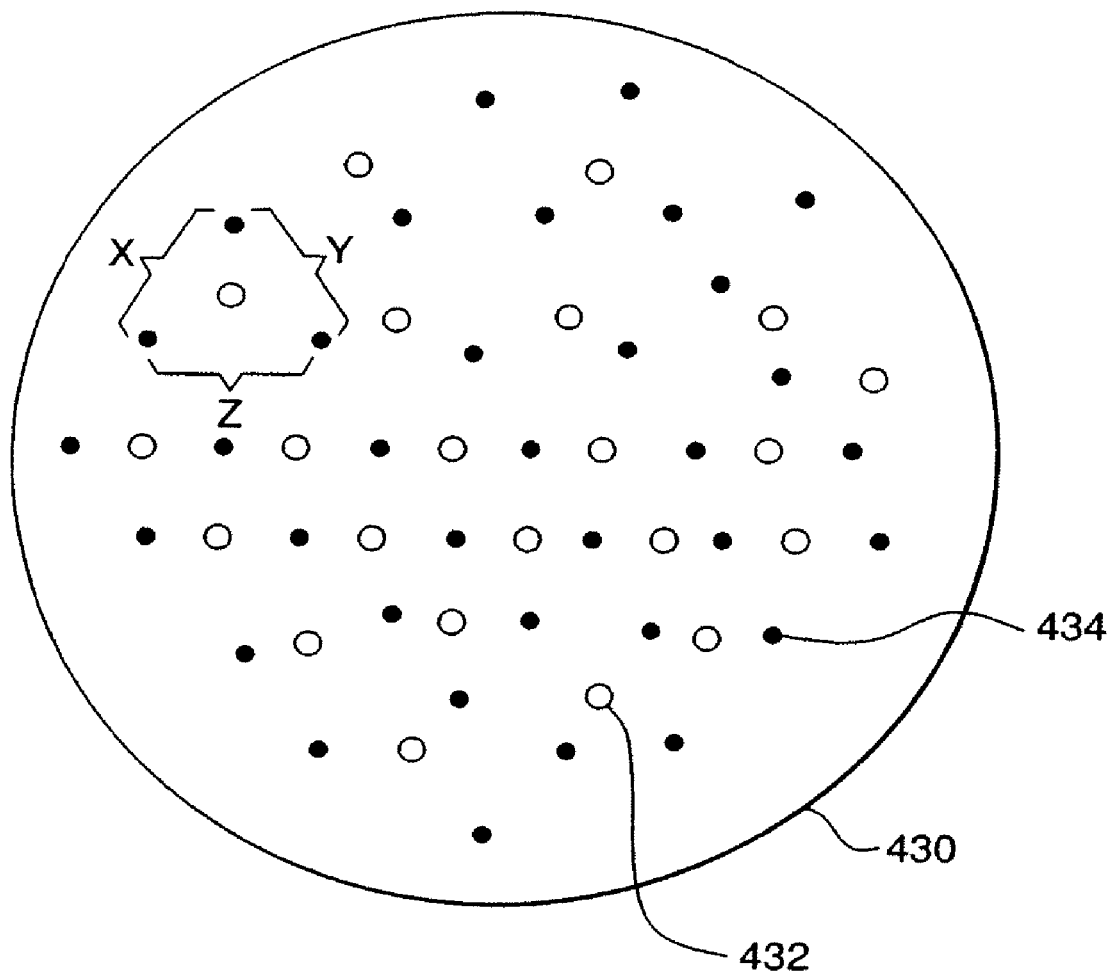
FIG. 11c provides a detailed top view of an embodiment of the conductive base that is provided in FIGS. 11a and 11b.

In certain embodiments, the plurality of conductive tips 434 may be arranged in a pattern wherein the arrangement of tips on conductive base 430 form a pattern with respect to each other such as a triangle, radial, square, cross, etc. Alternatively, the arrangement of conductive tips may be a random pattern. An example of one type of arrangement is illustrated in FIG. 11c wherein x, y, and z are substantially similar in length thereby forming an equilateral triangle. The length, geometry, and other attributes of each conductive tip may vary with respect to each other. Further, the tip density may vary depending upon such non-limiting factors as the production capability of the apparatus, the type of substrate, the amount of oxide to be removed, the number of additional electrodes, the flow rate of the gas mixture, the type and amount of the at least one energy source, etc.

The electrode material that acts as an emission electrode is preferably comprised of a conductive material with relatively low electron-emission energy or work function. The material preferably also has a high melting point and relatively high stability under processing conditions. Examples of suitable materials include metals, alloys, semiconductors, and oxides coated or deposited onto conductive substrates. Further examples include, but are not limited to, tungsten, graphite, high temperature alloys such as nickel chromium alloys, and metal oxides such as $BaO$ and $Al_2O_3$ that are deposited onto a conductive substrate.

The electrode that acts as a base electrode may comprised of a conductive material such as a metal or a semiconductive material. Examples of metals or semiconductive materials include any of the materials disclosed herein. In one particular embodiment, the base electrode may be comprised of a semiconductor such as the substrate itself, i.e., the wafer to be reflowed can be the base electrode. In these embodiments, the substrate may act as the second or the base electrode, for example, by being grounded. In an alternative embodiment, the base electrode can be a conductive material such as any of the materials used for the emission electrode. The base electrode can have a variety of different geometries depending upon the application.

Figure 4:
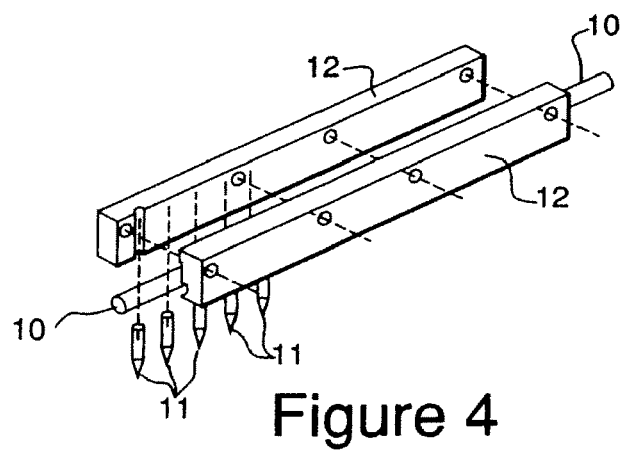
FIG. 4 provides an example of one embodiment of the electrode suitable for emission and/or retrieval of electrons having a segmented assembly.
Figure 2A:
Figure 2B:
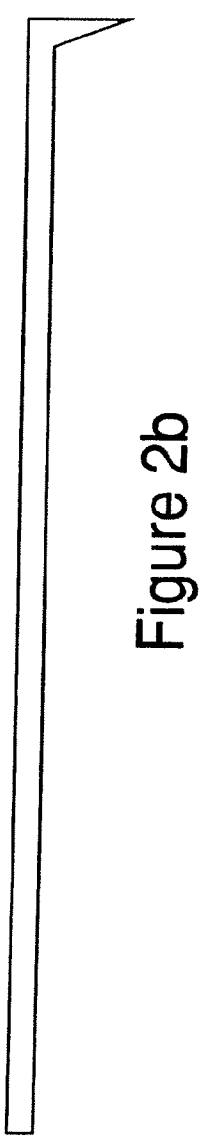
Figure 2C:
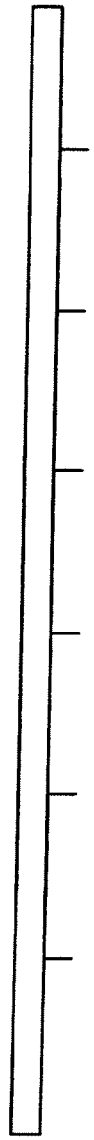
Figure 2D:
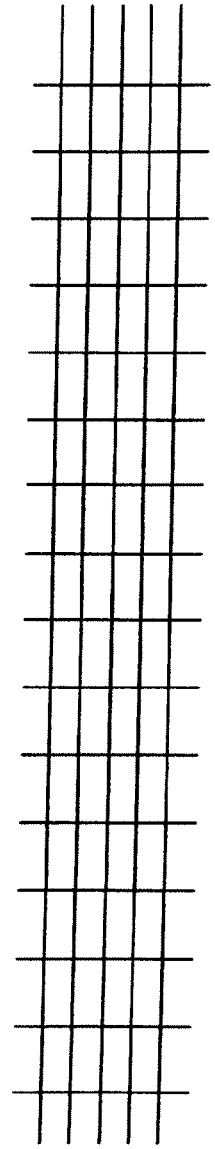
Figure 2H:
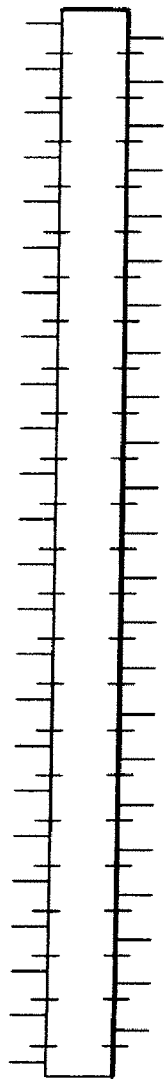
Figure 2H:
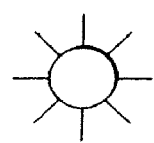
Figure 2I:
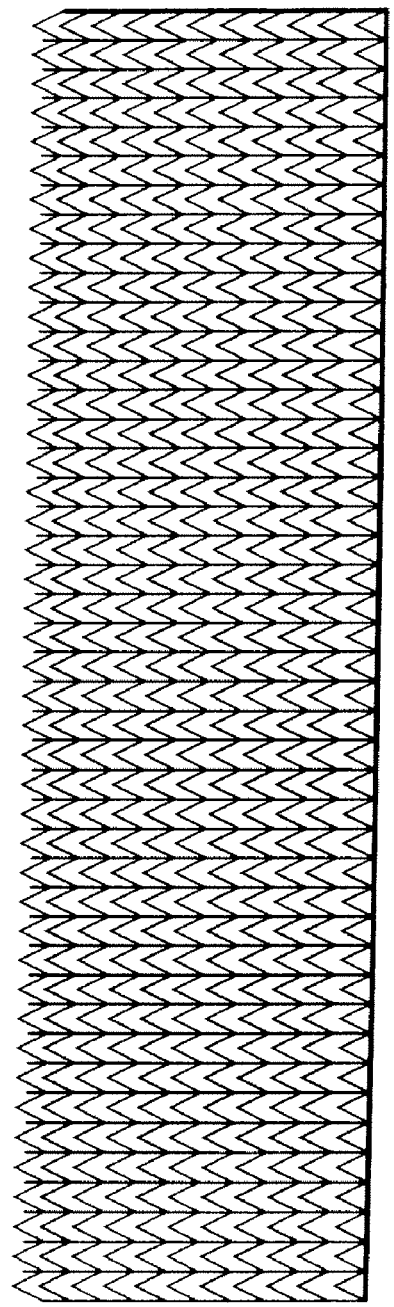

In certain embodiments of the present invention involving thermal-field emission, the emission electrode may comprise a segmented assembly such as the electrode depicted in FIG. 4. In this regard, the core 10 of the emission electrode may be made of a metal with a high electrical resistance. A plurality of tips 11 emanate from core 10. Tips 11 may be made of a conductive material with relatively low electron emission energy or work function such as any of the materials disclosed herein. The core may be heated by directly passing an AC or a DC current (not shown) through core 10. The thermal conduction will transfer the heat from the core to tips 11. The hot core 10 and the plurality of tips 11 are enclosed within an enclosure 12 which is then inserted into a support frame thereby forming a segmented assembly as shown. Tips 11 are exposed outside the enclosure 12. Enclosure 12 is composed of an insulating material. The segmented assembly allows for the thermal expansion of the core during operation. In this arrangement, electrons can be generated from hot tips 11 by applying a negative voltage bias on the emission electrode relative to the base electrode.

In another preferred embodiment of the present invention involving thermal-field emission, indirect heating can raise the temperature of the emission electrode. This may be accomplished by using a heating cartridge as the core of the emission electrode. The surface of the heating cartridge may be comprised of an electrically conductive material such as a metal that is electrically insulated from the heating element inside the cartridge. To promote electron emission, a plurality of distributed emission tips can be mounted on the surface of the heating cartridge. The cartridge can be heated by passing an AC or a DC current through the heating element inside the cartridge. Electrons can be generated from the distributed tips of the cartridge by applying a negative voltage bias on the surface of the cartridge relative to a second electrode. For creating the voltage bias in this arrangement, the second electrode can be grounded so that the cartridge may be negatively biased or, alternatively, the cartridge can be grounded so that the second electrode may be positively biased. In some embodiments, the latter case may be preferable for eliminating a potential interference between two electric circuits, e.g., one circuit may be the AC or DC current along the heating element, and the another circuit may be the high voltage bias between the surface of the cartridge and the second electrode. In these embodiments, the hot cartridge electrode may also act as a heat source for the gas mixture to achieve the required temperatures for the reflow process step.

As mentioned previously, a gas mixture comprising a reducing gas is passed through the electric field generated by the at least two electrodes. The reducing gas contained within the gas mixture may fall within one or more of the following categories: 1) an intrinsically reductant gas, 2) a gas capable of generating active species which form gaseous oxides upon reaction of the active species with the metal oxide, or 3) a gas capable of generating active species which form liquid or aqueous oxides upon reaction of the active species with the metal oxide.

The first category of gases, or an intrinsically reductant gas, includes any gas that thermodynamically acts as a reductant to the oxides to be removed. Examples of intrinsically reductant gases include $H_2$, $CO$, $SiH_4$, $Si_2H_6$, formic acid, alcohols such as, for example, methanol, ethanol, etc., and some acidic vapors having the following formula (III):

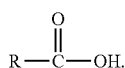
(III)

In formula (III), substituent R may be an alkyl group, substituted alkyl group, an aryl, or substituted aryl group. The term "alkyl" as used herein includes straight chain, branched, or cyclic alkyl groups, preferably containing from 1 to 20 carbon atoms, or more preferably from 1 to 10 carbon atoms. This applies also to alkyl moieties contained in other groups such as haloalkyl, alkaryl, or aralkyl. The term "substituted alkyl" applies to alkyl moieties that have substituents that include heteroatoms such as O, N, S, or halogen atoms; $OCH_3$; OR (R=alkyl $C_{1-10}$ or aryl $C_{6-10}$); alkyl $C_{1-10}$ or aryl $C_{6-10}$; $NO_2$; $SO_3R$ (R=alkyl $C_{1-10}$ or aryl $C_{6-10}$); or $NR_2$ (R=H, alkyl $C_{1-10}$ or aryl $C_{6-10}$). The term "halogen" as used herein includes fluorine, chlorine, bromine, and iodine. The term "aryl" as used herein includes six to twelve member carbon rings having aromatic character. The term "substituted aryl" as used herein includes aryl rings having subsitutents that include heteroatoms such as O, N, S, or halogen atoms; $OCH_3$; OR (R=alkyl $C_{1-10}$ or aryl $C_{6-10}$); alkyl $C_{1-10}$ or aryl $C_{6-10}$; $NO_2$; $SO_3R$ (R=alkyl $C_{1-10}$ or aryl $C_{6-10}$); or $NR_2$ (R=H, alkyl $C_{1-10}$ or aryl $C_{6-10}$). In certain preferred embodiments, the gas mixture contains hydrogen.

The second category of reducing gas includes any gas that is not an intrinsically reductive but can generate active species, such as, for example, H, C, S, H', C', and S', by dissociative attachment of electron on the gas molecules and form gaseous oxides by reaction of the active species with the metal oxides to be removed. Examples of this type of gas include: $NH_3$, $H_2S$, $C_1$ to $C_{10}$ hydrocarbons such as but not limited to $CH_4$, $C_2H_4$, acidic vapors having the formula (III), and organic vapors having the following formula (IV):

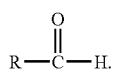
(IV)

In formulas (III) and (IV), substituent R may be an alkyl group, substituted alkyl group, an aryl, or substituted aryl group.

The third category of reducing gas includes any gas that is not an intrinsically reductive but can form active species, such as, for example, F, Cl, F', and Cl', by dissociative attachment of electron on the gas molecules and form liquid or aqueous oxides by reaction of the active species with the metal oxides. Examples of this type of gas include fluorine and chlorine containing gases, such as $CF_4$, $SF_6$, $CF_2Cl_2$, HCl, $BF_3$, $WF_6$, $UF_6$, $SiF_3$, $NF_3$, $CClF_3$, and HF.

Besides including one or more of the above categories of reducing gases, the gas mixture may further contain one or more carrier gases. The carrier gas may be used, for example, to dilute the reducing gas or provide collision stabilization. The carrier gas used in the gas mixture may be any gas with an electron affinity less than that of the reducing gas or gases within the gas mixture. In certain preferred embodiments, the carrier gas is an inert gas. Examples of suitable inert gases include, but are not limited to, $N_2$, Ar, He, Ne, Kr, Xe, and Rn.

In certain preferred embodiments, the gas mixture comprises hydrogen as the reducing gas and nitrogen as the carrier gas due to its relatively lower cost and the environmental friendliness of the exhaust gas release. In these embodiments, the gas mixture comprises from 0.1 to 100% by volume, or from 1 to 50% by volume, or from 0.1 to 4% by volume of hydrogen. Amounts of hydrogen lower than 4% are preferred, which makes the gas mixture non-flammable.

In certain embodiments, the gas mixture is passed through the field generated by the at least two electrodes at a temperature ranging from ambient to 450° C., or ranging from 100 to 350° C. The pressure of the gas mixture is preferably ambient atmospheric pressure, i.e., the existing pressure of the area of the process. No special pressure, such as vacuum, may be required. In embodiments where the gas mixture is pressurized, the pressure may range from 10 to 20 psia, or from 14 to 16 psia.

The substrate surface in which the oxides are to be removed is preferably located between the emission electrode and the base electrode with the surface facing the emission electrode. In certain preferred embodiments of the present invention, the substrate may be connected to the base electrode to provide a target assembly and facing the emission electrode. In these embodiments, the distance between the emission electrode and the top surface of the substrate or target assembly may range from 0.1 to 30 cm, or from 0.5 to 5 cm.

Figure 5:
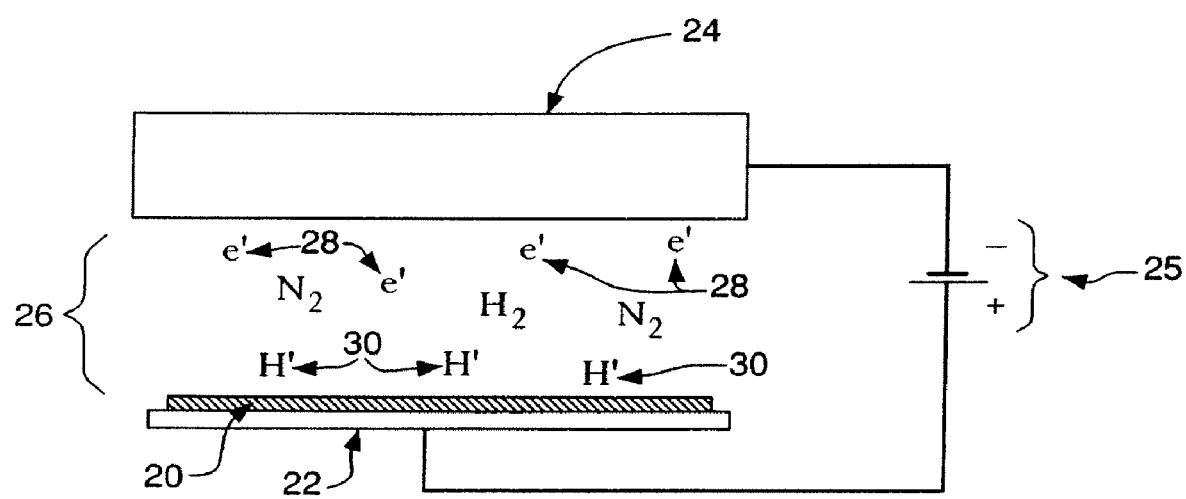
FIG. 5 provides an example of one embodiment of the present invention illustrating removal of surface metal oxides in a wafer bumping application.

FIG. 5 provides an illustration of the process used for a wafer bumping application wherein the substrate is silicon wafer 20. Referring to FIG. 5, a second electrode 24 is located above a wafer 20, and the wafer 20 comprising a plurality of solder bumps (not shown) is placed upon a first electrode 22 to form a target assembly. At least a portion of the surface of wafer 20 containing the plurality of solder bumps is exposed to second electrode 24. While the wafer 20 is shown as being placed upon first electrode 22, it is envisioned that the wafer 20 can be placed anywhere between electrodes 22 and 24. A pulsed voltage 25 is applied across the first electrode 22 and the second electrode 24 to generate an electric field. A gas mixture 26 containing hydrogen and nitrogen is passed through the electric field. Low energy electrons 28 are generated within the electric field which drift towards the first electrode 22 and wafer 20 disposed thereupon. In addition, a portion of the hydrogen within gas mixture 26 forms hydrogen ions 30 by electron attachment which also drift towards the first electrode 22 and wafer 20 disposed thereupon. The drift of negatively charged hydrogen ions 30 and electrons 28 towards the electrode 22 with wafer 20 disposed thereupon promotes adsorption of ions 30 onto the surface of wafer 20 and fosters de-oxidation of the wafer surface (referred to herein as surface de-oxidation).

Depending upon the conductivity of the substrate, some of the electrons that are generated as a reaction byproduct from surface de-oxidation can accumulate on the substrate surface. In addition, a portion of the free electrons can directly adsorb on the substrate due to the drifting along the electric field. This electron build-up on the substrate surface may prevent additional adsorption of the negatively charged ions as well as adversely affect the equilibrium of the surface de-oxidation. To make the surface de-oxidation process more efficient, the electrons on the substrate surface need to be periodically removed.

Figure 6:
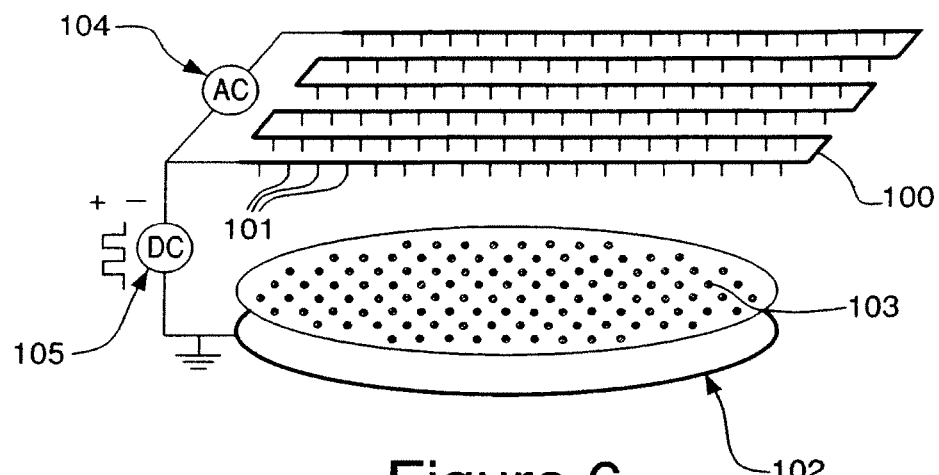
FIG. 6 illustrates a particular embodiment of the present invention for removing negatively charged ions on the substrate surface by changing the electrode polarity during the reflow of wafer bumps.
Figures 7A, 7B:
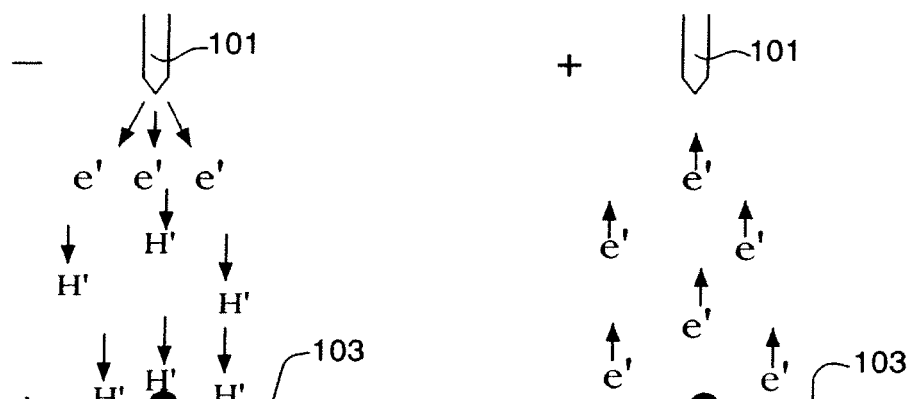
FIGS. 7a and 7b illustrates the transportation of the charged species between two electrodes when the polarity of the two electrodes is changed.
Figure 10A:
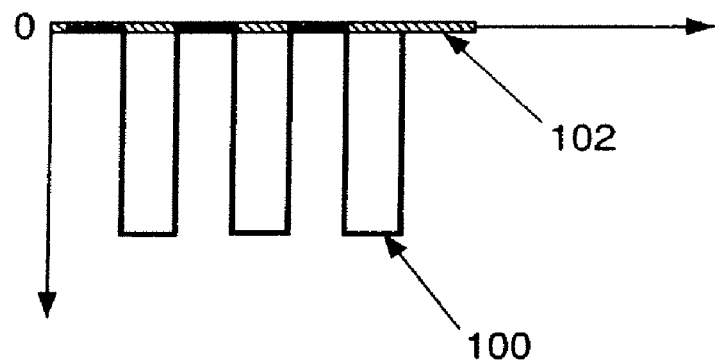
FIGS. 10a and 10b provide an illustration of an unidirectional voltage pulse and a bi-directional voltage pulse, respectively.
Figure 10B:
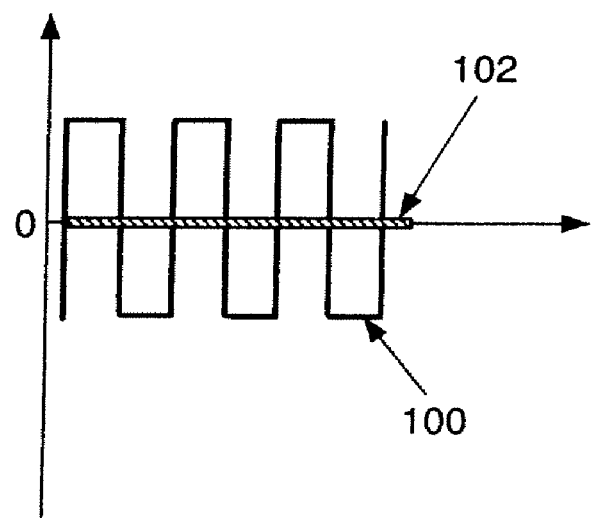

One method to remove the electrons on the substrate surface may be to change the polarity of both of the electrodes relative to each other. During the polarity change, the voltage level on each electrode may not necessarily be the same. In one embodiment, the polarity change can be achieved by applying a bidirectional voltage pulse between at least two electrodes such as that shown in FIG. 10b. FIG. 6 provides an example of a polarity change wherein an electrode may generate electrons in one phase of the voltage pulse (i.e., a negative bias) and retrieve electrons in another phase of the voltage pulse (i.e., a positive bias). In FIG. 6, electrode 100 is used as both the electron emission and electron retrieving electrode and electrode 102 is used a base electrode. This arrangement allows the efficiency of surface de-oxidation to be maximized. Electrode 100 containing a plurality of sharp tips 101 is located above wafer 103. Electrode 100 is heated by connecting to an AC power source 104. Another electrode 102 is located underneath wafer 103. The change in polarity of electrodes 100 and 102 can be obtained, for example, by a bi-directional pulsed DC power 105. An example of bidirectional voltage pulse is illustrated in FIG. 10b. When electrode 100 is negatively biased, at least a portion of the electrons generated from tips 101 attach to at least a portion of the reducing gas and newly created reducing gas ions drift towards wafer 103. When the polarity is reversed, electrons are released from the surface of wafer 103 and retrieved back at tips 101. FIGS. 7a and 7b illustrate the transportation of the charged species during each cycle of the voltage pulse. The frequency of changing the polarity of the two electrodes can range from 0 to 100 kHz.

Figure 8:
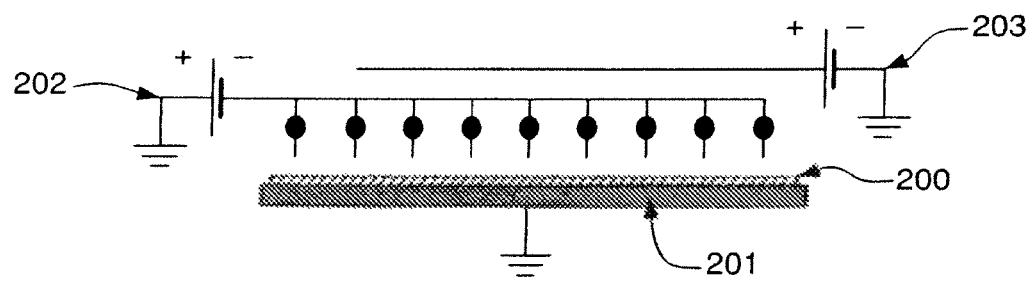
FIG. 8 provides an illustration of a particular embodiment of the present invention for removing electrons on the surface of a substrate by employing an additional electrode with a positive bias relative to the base electrode.

In an alternative embodiment, excess electrons on the substrate surface may be removed by employing one or more additional electrodes. FIG. 8 provides such an example wherein a wafer is the substrate. Referring to FIG. 8, wafer 200 is disposed upon a grounded base electrode 201. Two electrodes, electrode 202 having a negative voltage bias relative to base electrode 201 and electrode 203 having a positive voltage bias relative to base electrode 201 are installed above the wafer surface 200. In this arrangement, electrons are continually generated from electrode 202 and retrieved at electrode 203. In one particular embodiment, the polarity of electrode 202 and electrode 203 may be periodically changed from a positive to a negative voltage bias, and vice versa, relative to the base electrode 201.

In yet another embodiment, electrons or residual surface charge may be removed from the substrate surface by employing a neutralizer after surface de-oxidation. If left untreated, residual charge contamination can cause electrostatic discharge damage to sensitive electronic components. In these embodiments, flowing a high purity gas such as $N_2$ through a commercially available neutralizer device and then across the substrate surface can neutralize the residual charge on the wafer surface. The positive ions present in the gas will neutralize any residual electrons and provide an electrically neutral surface. Suitable charge neutralizer devices may, for example, consist of Kr-85 radioactive sources that produce equal densities of positive and negative ions in the gas. While positive and negative ions are produced in the gas as it flows through the wafer, the net charge of the gas stream is zero.

In certain embodiments, the substrate or target assembly may be moved with respect to the electrode that acts as an emission electrode. In this regard, the emission electrode may be in a fixed position and the substrate may be moved, the emission electrode may be moved and the substrate may be in a fixed position, or both the emission electrode and the substrate are moved. The movement may be vertical, horizontal, rotational, or along an arc. In these embodiments, surface de-oxidation may then occur within a localized area of the substrate surface.

Figure 9A:
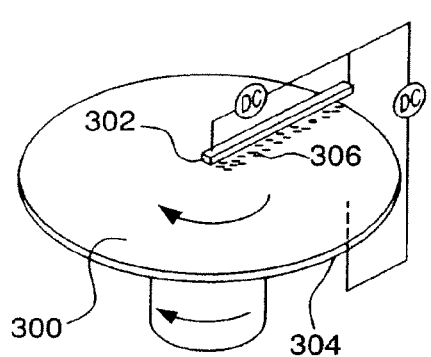
FIGS. 9a through 9e provide various illustrations of particular embodiments of the present invention employing movement of at least one electrode with respect to the substrate.
Figure 9B:
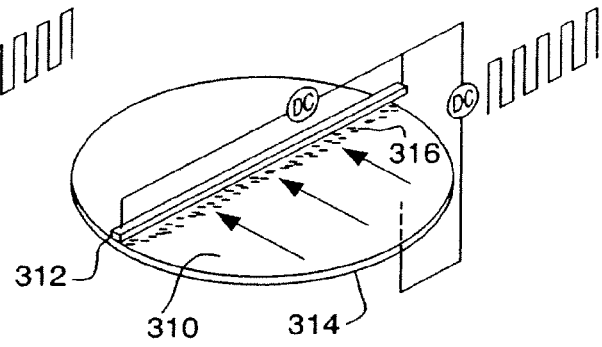
Figure 9C:
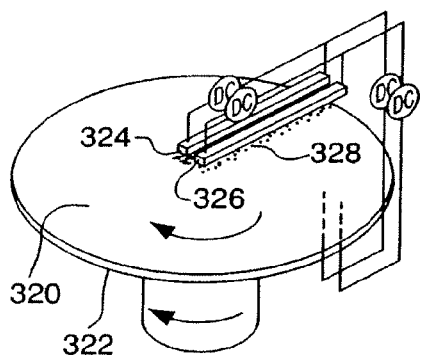
Figure 9D:
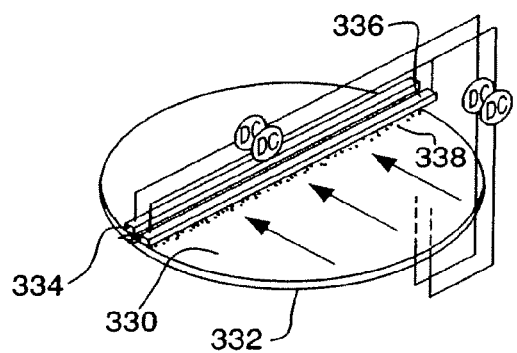
Figure 9E:
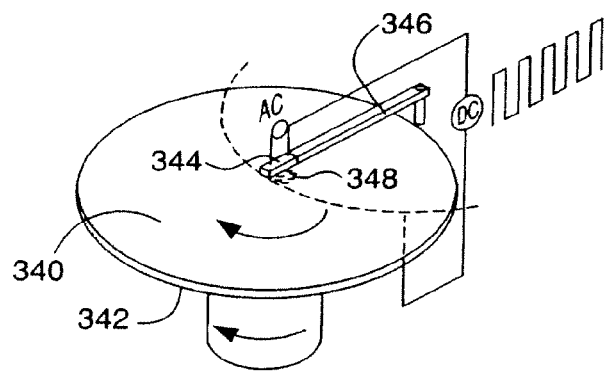

For the following FIGS. 9a through 9e, the substrate is a silicon wafer that is disposed upon a base electrode, which is grounded. At least portion of the wafer surface comprising a plurality of solder bumps (not shown) is exposed to a second electrode that acts as both an emitting and a retrieving electrode (i.e., changing polarity, for example, from a negative to a positive bias in electrical potential). FIG. 9a shows a silicon wafer 300 moved rotationally under a heated linear electrode 302 to which is applied a bi-directionally pulsed voltage relative to the base electrode 304 that may cycled in a frequency range from 0 to 100 KHz thereby generating an ion area shown as 306. A motor located outside the processing chamber (not shown) rotates the wafer. Such rotation is frequently accomplished in semiconductor processing without significant contamination of the wafer surface. Contamination may be avoided by employing high cleanliness, rotational feed-throughs and control of flow patterns. FIG. 9b shows a silicon wafer 310 moved linearly under a heated linear electrode 312 to which is applied a bi-directionally pulsed voltage relative to the base electrode 314 thereby generating an ion area shown as 316. This arrangement may be suitable for applications wherein a conveyor belt is used to move wafers through tubular bumping furnaces such as, for example, printed circuit boards through reflow furnaces. FIG. 9c shows a silicon wafer 320 moved rotationally under a pair of heated linear emission electrodes 324 and 326: the base electrode 322 has a steady positive bias and the emission electrodes 324 and 326 has a steady negative bias relative to the base electrode 322 so that electrons can be generated to and be retrieved back from the wafer surface thereby generating an ion area shown as 328. A motor located outside the processing chamber (not shown) rotates the wafer. FIG. 9d shows a silicon wafer 330 moved linearly under a heated pair of linear electrodes 334 and 336 that are held at steady and opposite polarities relative to the base electrode 332 to conduct electron emission and retrieving separately thereby generating an ion area shown as 338. Lastly, FIG. 9e employs a relatively smaller electrode 344 located on the end of a pivoting arm 346. The polarity of the electrode 344 is frequently altered relative to the base electrode 342 thereby generating an ion area shown as 348. The arm is swung over a rotating wafer 340, in for example an arc-like motion, to affect complete and uniform treatment of the entire wafer surface.

The method of the present invention can be used in several areas of the microelectronics manufacturing in addition to the reflow of a solder bumped wafer such as, for example, surface cleaning, metal plating, brazing, welding, and reflow and wave soldering for outer lead bonding. An example of reflow and wave soldering apparatuses that are suitable for the method of present invention is shown in FIGS. 1-3 provided in pending U.S. application Ser. No. 09/949,580 which assigned to the assignee of the present invention and is incorporated herein by reference it its entirety. In one particular embodiment, the method of the present invention can be used to reduce surface oxides of metals, such as copper oxide, formed during silicon wafer processing or thin film de-oxidation. Such oxides may form as a result of the various wet processing steps, such as chemical mechanical planarization, that are used to form micro-electronic devices on the wafers. These surface oxides reduce device yield and device reliability. The present invention allows surface oxides to be removed in a fully dry, environmentally friendly manner that does not require the use of aqueous reducing agents. Further, since the present invention is performed at relatively low temperatures, it does not significantly affect the thermal budget of the device during processing. Higher temperatures, by contrast, tend to reduce device yield and reliability by causing diffusion of dopants and oxides thereby reducing device performance. Since the method of the present invention can be performed on a single wafer, the method can be integrated with other single wafer processes, thereby providing better compatibility with other fabrication steps.

The method and apparatus of the present invention are particularly suitable for applications of wafer bumping and thin film de-oxidation. The conveniences of using the present invention for wafer bumping and thin film de-oxidation are numerous. First, compared to typical reflow soldering processes for outer lead bonding, wafer bumping and thin film de-oxidation are both single-face treatment. In this connection, the space above the surface to be deoxidized can be as small as 1 cm, thereby resulting in an efficient process for both ion generation and transportation. Second, the processing temperatures for reflow in wafer bumping are significantly higher than that of typical reflow soldering processes. The higher temperatures promote the formation of the negatively charged ions by electron attachment. Third, in wafer bumping and thin film de-oxidation processes, the solder bumps and thin films are completely exposed thereby minimizing any "shadow" effect during surface de-oxidation. Further, compared to other soldering processes whereby the solder has to wet and spread over the component surface, the deposited solder bumps on the wafer need only exhibit solder ball formation upon first reflow.

The invention will be illustrated in more detail with reference to the following examples, but it should be understood that the present invention is not deemed to be limited thereto.

EXAMPLE 1

A first experiment was conducted by using a lab-scale furnace. The sample used was a fluxless tin-lead solder preform (melting point 183° C.) on a grounded copper plate (anode), which was loaded inside a furnace and heated up to 250° C. under a gas flow of 5% $H_2$ in $N_2$. When the sample temperature was at equilibrium, a DC voltage was applied between the negative electrode (cathode) and the grounded sample (anode) and gradually increased to about −2 kV with a current of 0.3 mA. The distance between the two electrodes was about 1 cm. The pressure was ambient, atmospheric pressure. It was found that the solder was indeed very well wetted on the copper surface. Without applying an electric voltage, a good wetting of a fluxless solder on a copper surface can never be achieved at such low temperature, even in pure $H_2$, because the effective temperature for pure $H_2$ to remove tin-oxides on a tin-based solder is above 350° C. Therefore, this result confirms that the electron-attachment method is effective in promoting $H_2$ fluxless soldering.

EXAMPLE 2

Several cathode materials were investigated for electron-attachment assisted hydrogen fluxless soldering by using the field emission mechanism using the same set-up as example 1. The results of the investigation is provided in Table I.

As Table I illustrates, the best result was obtained by using a Ni/Cr cathode, which provided the highest fluxing efficiency and thus resulted in the shortest wetting time. It is believed that the Ni/Cr cathode generates a relatively larger quantity of electrons and has suitable energy level of the electrons compared to other cathode materials.

TABLE I

Effect of Cathode Material on Wetting Time at 250° C. and 20% $H_2$

| Material of Cathode Rod With a Sharp Tip (1/16" dia.) | Time to Complete Wetting |
|---|---|
| Brass | 1 min 55 sec |
| Copper | 1 min 44 sec |
| Nickel Chromium | 39 sec |
| Aluminum | 1 min 28 sec |
| Stainless Steel | 1 min |
| Tungsten | 1 min 54 sec |

EXAMPLE 3

The present example was conducted to investigate the effectiveness of the thermal-field emission method for generating electrons. A 3 mm diameter graphite rod, having a number of 1 mm long machined tips protruding from its surface, acted as the cathode and had a geometry similar to that depicted in FIG. 2i. Each of the protruding machined tips had a tip angle of 25 degrees. The graphite rod was heated up in a gas mixture of 5% $H_2$ and 95% $N_2$ to about 400 to 500° C. by resistive heating using an AC power source. A DC voltage source of 5 KV was applied between the graphite cathode and a copper plate that acted as an anode having a 1.5 cm gap therebetween. All the tips on the graphite rod were illuminated thereby indicating that electrons could uniformly be generated from the distributed tips on the graphite rod. Without heating of the graphite rod, there would be either no electron emission from the cathode, or arcing between one of the tips and the anode plate. This demonstrates that the combination of using a cathode having multiple tips and elevated temperatures, i.e., a thermal-field emission method, is effective for obtaining uniform electron emission from an integrated emitting system.

EXAMPLE 4

The present example was conducted using a 0.04" diameter nickel-chromium alloy heating wire clamped horizontally between two machined $Al_2O_3$ refractory plates such as the electrode illustrated in FIG. 4. A series of five nickel-chromium alloy emitting wires, each with a sharp tip (12.5 degree) on one end of the wire, protruded perpendicularly from the nickel-chromium heating wire and were vertically positioned between two refractory plates. The nickel-chromium heating wire and tips were heated up in a gas mixture of 5% $H_2$ and 95% $N_2$ to about 870° C. using an AC power source. A DC voltage of 2.6 KV was applied between the cathode and a copper plate that acted as the anode having a 6 mm gap between the two electrodes. All five tips were illuminated and the total emission current reached 2.4 mA. Without heating of the wire, there would be either no electron emission from the cathode, or arcing between one of the tips and the anode plate. Like example 3, example 4 demonstrates that thermal-assisted field emission provides uniform electron emission. Further, because of the higher temperature of the emission electrode, it also increases the quantity of the electron emission at a given electric potential.

EXAMPLE 5

The present example was conducted to demonstrate the effect of a voltage pulse between two electrodes on cathode emission. A single-tip nickel-chromium alloy wire was used as the emission electrode and a grounded copper plate acted as a base electrode. The copper plate was located 3 mm below the tip of the emission electrode. A tin/lead solder preform was disposed upon the copper plate. The nickel-chromium wire, preform, and copper plate were maintained in a furnace at ambient temperature in a gas mixture of 4% $H_2$ and the remainder $N_2$. A pulsed uni-directional voltage of various frequencies and amplitudes was applied between the two electrodes. In this connection, the electric potential of the emission electrode was varied from negative to zero relative to the grounded base electrode thereby allowing electrons to be generated from the tip electrode. The results are provided in Table II.

The results in Table II indicate that greater quantities of electrons are generated from the emission electrode when a voltage pulse of higher pulsing frequency and amplitude is applied.

TABLE II

| Uni-Directional Voltage Pulse | | | | | |
|---|---|---|---|---|---|
| | Pulsing Frequency (Hz) | | | | |
| | 0 | 250 | 500 | 1000 | 2500 |
| Emission Current at 3.4 kV Pulsing Amplitude (mA) | 0 | 0.3 | 0.4 | 0.5 | 0.6 |
| Emission Current at 1.0 kV Pulsing Amplitude (mA) | 0 | 0.1 | 0.1 | 0.2 | 0.2 |

EXAMPLE 6

The present example was conducted to demonstrate surface discharge by altering the polarity of the two electrodes using the same set-up as example 5.

A bi-directional voltage pulse with a total pulsing amplitude of 3.4 kV (e.g. from +1.7 kV to −1.7 kV) was applied between the two electrodes. During the bi-directional voltage pulse, the polarity of the two electrodes was changed. In other words, the tip of the emission electrode was varied from a positive to a negative electrical bias relative to the grounded base electrode thereby allowing electrons to be generated from and retrieved to the tip electrode.

Table III provides the leakage current from the base electrode for each frequency of the polarity change. As Table III illustrates, the higher the frequency of the polarity change, the lower the charge build up will be by observing the leakage current passing through the copper base electrode.

TABLE III

| Bi-Directional Voltage Pulse | | | | |
|---|---|---|---|---|
| | Pulsing Frequency (Hz) | | | |
| | 250 | 500 | 1000 | 2500 |
| Leakage Current (mA) | 0.00069 | 0.00054 | 0.00015 | 0.00015 |

EXAMPLE 7

The present example was conducted to demonstrate remote surface discharge by employing an additional electrode. A 90 Pb/10 Sn solder preform having a melting point of 305° C. was set on a small piece of a copper substrate that was set on an electrically insulated wafer. A grounded copper plate was placed underneath the wafer and acted as a base electrode. Two single-tip nickel-chromium wires, one with a negative voltage and one with a positive voltage, were installed 1 cm above the base electrode with the solder preform. The distance between the two single-tip electrodes was 1.5 cm. The arrangement was heated within a gas mixture containing 4% $H_2$ in $N_2$ from room temperature to a given reflow temperature above the melting point of the solder. When the reflow temperature reached equilibrium, electron attachment was started by applying the positive and the negative voltages to the two single-tip electrodes and the time required for the solder preform to form a spherical ball was recorded. The formation of a spherical solder ball indicated an oxide-free solder surface. As shown in Table IV, the surface de-oxidation is quite efficient at a range of temperature from 310 to 330° C., which is only 5 to 15° C. above the melting point of the solder.

TABLE IV

| | Isotherm Reflow Temperature (° C.) | | |
|---|---|---|---|
| | 310 | 320 | 330 |
| Ball formation Time (seconds) | 20, 18, 20, 24 | 17, 13, 16 | 14, 12 |
| Average Ball Formation Time (seconds) | 20.5 | 15.3 | 13 |

EXAMPLE 8

The lifetime of an emission tip was tested under a constant electric field with $N_2$ purging using a similar experimental setup as that in Example 1. The tip emission has been maintained at 0.3 mA with a constant field of ~2.2 KV/cm for over thousand hours. The result confirms the long lasting performance of the field emission tip due to a neglected ion and electron erosion.

While the invention has been described in detail and with reference to specific examples thereof, it will be apparent to one skilled in the art that various changes and modifications can be made therein without departing from the spirit and scope thereof.

The invention claimed is:

1. An apparatus for removing metal oxides from a surface of a substrate comprising a plurality of solder bumps wherein the substrate resides within a target area, the apparatus comprising:
   an at least one energy source;
   at least one gas supply source of a gas mixture comprising a reducing gas; and
   an electrode assembly in electrical communication with the at least one energy source and in fluid communication with the at least one gas supply source, comprising:
   a housing that is at least partially comprised of an insulating material and having an internal volume and at least one fluid inlet that is in fluid communication with the internal volume and the at least one gas supply source; and
   a conductive base which resides at the bottom of the housing and connected to the housing comprising a plurality of conductive acicular tips that extend therefrom into the target area and a plurality of perforations that extend through the conductive base and are in fluid communication with the internal volume to allow for a passage of the gas mixture.

2. The apparatus of claim 1 wherein the substrate is grounded.

3. The apparatus of claim 1 wherein the distance between the end of the plurality of conductive tips and the surface of the substrate ranges from 0.1 to 30 cm.

4. The apparatus of claim 3 wherein the distance between the end of the plurality of conductive tips and the surface of the substrate ranges from 0.5 to 5 cm.

5. The apparatus of claim 1 further comprising a neutralizer capable of removing residual charges from the surface of the substrate by providing an ionized gas containing equal densities of positive and negative ions.

6. The apparatus of claim 1 wherein the reducing gas is a gas selected from the group consisting of H2, CO, Si114, Si2H6, OF4, SF6, CF2Cl2, HCl, BF3, WF6, UF6, SiF3, NF3, CClF3, HF, NH3, H2S, straight, branched or cyclic C1 to C10 hydrocarbons, formic acid, alcohols, acidic vapors having the following formula (III):

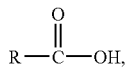

(III)

organic vapors having the following formula (IV),

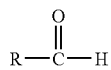

(IV)

and mixtures thereof, wherein substituent R in formula (111) and formula (IV) is an alkyl group,
a substituted alkyl group, an aryl group, or a substituted aryl group.

7. The apparatus of claim 1 wherein the gas mixture comprises 0.1 to 100% by volume of hydrogen.

8. The apparatus of claim 7 wherein said gas mixture is 0.1 to 4% by volume of hydrogen.

9. The apparatus of claim 1 wherein the gas mixture further comprises a carrier gas.

10. The apparatus of claim 9 wherein the carrier gas comprises at least one gas selected from the group consisting of nitrogen, helium, argon, neon, xenon, krypton, radon, or mixtures thereof.

11. The apparatus of claim 9 wherein the carrier gas has an electron affinity that is less than the electron affinity of the reducing gas.

12. The apparatus of claim 1 wherein the substrate is at a temperature ranging from 0 to 450° C.

13. The apparatus of claim 1 wherein the at least one energy source comprises an electric energy source.

* * * * *

UNITED STATES PATENT AND TRADEMARK OFFICE
CERTIFICATE OF CORRECTION

PATENT NO. : 7,883,602 B2  
APPLICATION NO. : 12/188667  
DATED : February 8, 2011  
INVENTOR(S) : Chun Christine Dong et al.

Page 1 of 1

It is certified that error appears in the above-identified patent and that said Letters Patent is hereby corrected as shown below:

Column 19

Line 14, delete "H2, CO, Si114," and insert -- $H_2$, CO, $SiH_4$, --

Line 15, delete "Si2H6, OF4, SF6, CF2Cl2, HCl, BF3, WF6, UF6, SiF3, NF3," and insert
-- $Si_2H_6$, $CF_4$, $SF_6$, $CF_2Cl_2$, HCl, $BF_3$, $WF_6$, $UF_6$, $SiF_3$, $NF_3$, $CClF_3$, HF, $NH_3$, --

Line 16, delete "CClF3, HF, NH3, H2S, straight, branched or cyclic C1 to C10" and insert
-- $H_2S$, straight, branched or cyclic $C_1$ to $C_{10}$ --

Column 20

Line 1, delete "(111)" and insert -- (III) --

Signed and Sealed this  
Twenty-first Day of June, 2011

David J. Kappos  
*Director of the United States Patent and Trademark Office*